(12) United States Patent
Subramani et al.

(10) Patent No.: US 11,335,543 B2
(45) Date of Patent: May 17, 2022

(54) RF RETURN PATH FOR REDUCTION OF PARASITIC PLASMA

(71) Applicant: Applied Materials, Inc., Santa Clara, CA (US)

(72) Inventors: Anantha K. Subramani, San Jose, CA (US); Arun Kumar Kotrappa, Karnataka (IN); Hanish Panavalappil Kumarankutty Kumar, Karnataka (IN); Ramcharan Sundar, Tamil nadu (IN)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/829,993

(22) Filed: Mar. 25, 2020

(65) Prior Publication Data
US 2021/0305020 A1    Sep. 30, 2021

(51) Int. Cl.
*H01J 37/32*   (2006.01)

(52) U.S. Cl.
CPC .. *H01J 37/32513* (2013.01); *H01J 37/32082* (2013.01); *H01J 37/32715* (2013.01); *H01J 2237/20235* (2013.01)

(58) Field of Classification Search
None
See application file for complete search history.

(56) References Cited

U.S. PATENT DOCUMENTS

| | | | | |
|---|---|---|---|---|
| 6,221,221 B1 * | 4/2001 | Al-Shaikh | ......... | H01J 37/32577 204/298.02 |
| 7,252,737 B2 * | 8/2007 | Brown | ............. | H01L 21/67069 156/345.51 |
| 7,732,728 B2 * | 6/2010 | Dhindsa | ............ | H01J 37/32091 219/121.48 |
| 8,522,716 B2 * | 9/2013 | Kadkhodayan | ..... | C23C 16/4401 118/723 I |
| 8,559,159 B2 * | 10/2013 | Roy | .................. | H01L 21/67103 361/234 |

(Continued)

FOREIGN PATENT DOCUMENTS

| | | |
|---|---|---|
| EP | 2518763 B1 | 9/2015 |
| WO | 2010042860 A2 | 4/2010 |

OTHER PUBLICATIONS

International Search Report and Written Opinion from PCT/US2021/020554 dated Jun. 23, 2021, 9 pgs.

*Primary Examiner* — Srinivas Sathiraju
(74) *Attorney, Agent, or Firm* — Schwabe, Williamson & Wyatt, P.C.

(57) ABSTRACT

Embodiments disclosed herein include an RF return assembly. In an embodiment, the RF return assembly comprises a first plate with a flange, where a first hole and a second hole pass through the flange. The RF return assembly may further comprise a second plate over the first plate, and a first body positioned above the flange. In an embodiment, the RF return assembly further comprises a second body positioned below the flange, where the first body is affixed to the second body by a pillar that passes through the first hole. In an embodiment, the RF return assembly further comprises a spring attached between the second plate and the second body, where the spring passes through the second hole, and a conductive band to electrically couple the first body to the flange.

19 Claims, 11 Drawing Sheets

(56) References Cited

U.S. PATENT DOCUMENTS

| | | | |
|---|---|---|---|
| 9,404,176 B2* | 8/2016 | Parkhe | H01J 37/32577 |
| 10,170,279 B2* | 1/2019 | Kenney | H01J 37/321 |
| 2003/0029564 A1* | 2/2003 | Brown | H01J 37/321 |
| | | | 156/345.1 |
| 2007/0091541 A1* | 4/2007 | Buchberger | H01L 21/67069 |
| | | | 361/234 |
| 2008/0320541 A1* | 12/2008 | Zinevich | H04N 17/00 |
| | | | 725/127 |
| 2009/0188625 A1* | 7/2009 | Carducci | H01J 37/32623 |
| | | | 156/345.34 |
| 2009/0200269 A1 | 8/2009 | Kadkhodayan et al. | |
| 2009/0242383 A1* | 10/2009 | Vukovic | H01J 37/3441 |
| | | | 204/164 |
| 2010/0065213 A1* | 3/2010 | Carducci | H01J 37/32623 |
| | | | 156/345.1 |
| 2011/0164955 A1* | 7/2011 | White | H01L 21/68742 |
| | | | 414/800 |
| 2012/0003836 A1* | 1/2012 | Kellogg | H01L 21/68735 |
| | | | 438/710 |
| 2012/0033340 A1* | 2/2012 | Roy | H01L 21/6831 |
| | | | 361/234 |
| 2013/0319854 A1 | 12/2013 | Parkhe et al. | |
| 2015/0040829 A1* | 2/2015 | Ramaswamy | H01J 37/32596 |
| | | | 118/723 E |
| 2019/0108983 A1* | 4/2019 | Noorbakhsh | E05D 15/56 |

* cited by examiner

RF RETURN PATH FOR REDUCTION OF PARASITIC PLASMA

BACKGROUND

1) Field

Embodiments relate to plasma chambers, and more particular to RF return paths in plasma chambers that reduce parasitic plasma generation.

2) Description of Related Art

Semiconductor manufacturing often relies on the use of plasmas for deposition, etching, and/or cleaning processes. As the critical dimensions of features on a workpiece continue to decrease, the importance of a uniform plasma increases. One source of plasma non-uniformity that may be present in a plasma chamber is the presence of a parasitic plasma. Parasitic plasmas reduce plasma control, and, therefore, limits process control in the plasma chamber.

Parasitic plasmas may be generated, at least in part, by an inefficient RF return path. For example, in a typical plasma chamber, the RF return path will pass along the chamber body and back up to the pedestal along a path that includes a baffle. This long path results in arcing and energy dissipation into the surrounding vacuum space, and causes a parasitic plasma to form around the pedestal of the plasma chamber.

SUMMARY

Embodiments disclosed herein include an RF return assembly. In an embodiment, the RF return assembly comprises a first plate with a flange, where a first hole and a second hole pass through the flange. The RF return assembly may further comprise a second plate over the first plate, and a first body positioned above the flange. In an embodiment, the RF return assembly further comprises a second body positioned below the flange, where the first body is affixed to the second body by a pillar that passes through the first hole. In an embodiment, the RF return assembly further comprises a spring attached between the second plate and the second body, where the spring passes through the second hole, and a conductive band to electrically couple the first body to the flange.

Embodiments disclosed herein may also include a plasma chamber. In an embodiment, the plasma chamber comprises a chamber body with an opening sized to receive a workpiece, and an RF return ledge above the opening. In an embodiment, the plasma chamber further comprises a lid to seal the chamber body, and a pedestal for supporting the workpiece. In an embodiment, the pedestal comprises a first plate with a flange, and a second plate attached to the first plate. In an embodiment, the plasma chamber further comprises an RF return assembly, where the RF return assembly electrically couples the RF return ledge to the pedestal.

Additional plasma chambers in accordance with various embodiments may also comprise a chamber body, where the chamber body comprises an opening sized to receive a workpiece, and an RF return ledge above the opening. In an embodiment, the plasma chamber further comprises a lid to seal the chamber body, and a pedestal for supporting the workpiece. In an embodiment, the pedestal comprises a first plate with a flange, and a second plate attached to the first plate. In an embodiment, the plasma chamber further comprises an RF return assembly. In an embodiment, the RF return assembly electrically couples the RF return ledge to the pedestal, and comprises a first ring, wherein the first ring is above the flange, a second ring, wherein the second ring is below the flange, a pillar to affix the first ring to the second ring, wherein the pillar passes through the flange, a tension spring, wherein the tension spring is attached between the second plate and the second ring, and wherein the tension spring passes through the flange, and a conductive band, wherein the conductive band electrically couples the first ring to the flange, and wherein the conductive band is flexible to maintain electrical contact between the first ring and the flange as the first plate displaces relative to the first ring.

The above summary does not include an exhaustive list of all embodiments. It is contemplated that all systems and methods are included that can be practiced from all suitable combinations of the various embodiments summarized above, as well as those disclosed in the Detailed Description below and particularly pointed out in the claims filed with the application. Such combinations have particular advantages not specifically recited in the above summary.

DETAILED DESCRIPTION

Devices in accordance with embodiments described herein include a plasma chamber with an RF return assembly for reducing parasitic capacitance. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

Figure 1A:
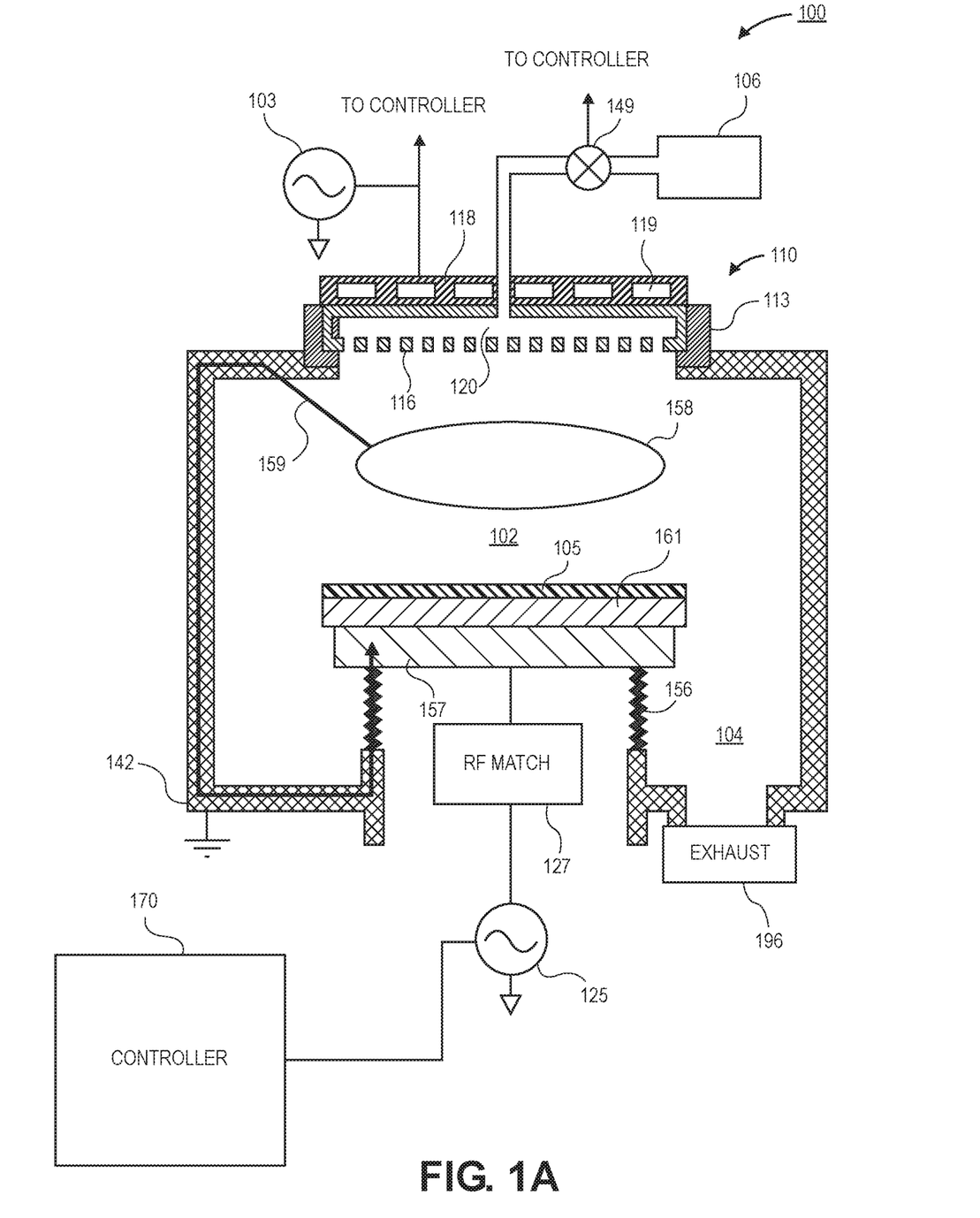
FIG. 1A is a cross-sectional illustration of a plasma chamber with a standard RF return path that passes along the bellows.

As noted above, parasitic plasmas may result in plasma non-uniformities. This results in non-uniform process control of plasma processing operations within a plasma chamber. An exemplary plasma chamber 100 is shown in FIG. 1A. For example, FIG. 1A is a cross-sectional illustration of a conventional plasma chamber 100. The plasma chamber 100 may be a plasma etch chamber, a plasma enhanced chemical vapor deposition chamber, a physical vapor deposition chamber, a plasma treatment chamber, an ion implantation chamber, or other suitable vacuum processing chamber.

Plasma chamber 100 includes a grounded chamber body 142. In some instances, the chamber body 142 may also comprise a liner (not shown) to protect the interior surfaces of the chamber body 142. The chamber body 142 may comprise a processing region 102 and an evacuation region 104. The chamber body 142 may be sealed with a lid assembly 110. Process gases are supplied from one or more gas sources 106 through a mass flow controller 149 to the lid assembly 110 and into the chamber 142. An exhaust port 196 proximate to the evacuation region 104 may maintain a desired pressure within the chamber body 142 and remove byproducts from processing in the chamber body 142. The mass flow controller 149 may be controlled by the system controller 170.

The lid assembly 110 generally includes an upper electrode comprising a showerhead plate 116 and a heat transfer plate 118. The lid assembly 110 is isolated from the chamber body 142 by an insulating layer 113. The upper electrode is coupled to a source RF generator 103 through a match (not shown). Source RF generator 103 may have a frequency between 100 and 180 MHz, for example, and in a particular embodiment, is in the 162 MHz band. The source RF generator may be connected to the controller 170. The gas from the gas source 106 enters into a manifold 120 within the showerhead plate 116 and exits into processing region 102 of the chamber body 142 through openings into the showerhead plate 116. In an embodiment, the heat transfer plate 118 comprises channels 119 through which heat transfer fluid is flown. The showerhead plate 116 and the heat transfer plate 118 are fabricated from an RF conductive material, such as aluminum or stainless steel. In certain embodiments, a gas nozzle or other suitable gas distribution assembly is provided for distribution of process gases into the chamber body 142 instead of (or in addition to) the showerhead plate 116.

The processing region 102 may comprise a lower electrode 161 onto which a substrate 105 is secured. The substrate 105 may be inserted into (or extracted from) the chamber body 142 through a slit valve tunnel (not shown) through the chamber body 142. The lower electrode 161 may be an electrostatic chuck. The lower electrode 161 may be supported by a support member 157. In an embodiment, lower electrode 161 may include a plurality of heating zones, each zone independently controllable to a temperature set point. For example, lower electrode 161 may comprise a first thermal zone proximate a center of substrate 105 and a second thermal zone proximate to a periphery of substrate 105. Bias power RF generator 125 is coupled to the lower electrode 161 through a match 127. Bias power RF generator 125 provides bias power, if desired, to energize the plasma. Bias power RF generator 125 may have a low frequency between about 1 MHz to 60 MHz for example, and in a particular embodiment, is in the 13.56 MHz band. The bias RF generator 125 may be connected to the controller 170.

In an embodiment, the support member 157 is displaceable in the vertical direction. For example, a baffle 156 connected between the support member 157 and the chamber body 142 may extend and contract to allow for vertical movement of the support member 157.

FIG. 1A also illustrates the typical RF return path 159 for the plasma chamber 100. As shown, the RF return path 159 begins at the plasma 158 and enters the chamber body 142. The RF return path 159 continues along the chamber body 142 to the baffle 156 and up to the support member 157. Due to the structure of the baffle 156, the RF return path 159 is rather long. This long path results in arcing and energy dissipation into the surrounding vacuum space (e.g., evacuation region 104), and causes a parasitic plasma to form around the pedestal of the plasma chamber 100.

Accordingly, embodiments disclosed herein include an RF return assembly that short-circuits the RF return path. Particularly, the RF return path in embodiments disclosed herein eliminates the routing across the baffle. By reducing the length of the RF return path, energy dissipation is reduced and the parasitic plasma is eliminated. Furthermore, embodiments disclosed herein include an RF return assembly that provides a short circuit path when the plasma chamber is in various processing or cleaning positions. As such, parasitic plasmas are eliminated during plasma processing and during plasma cleaning.

Figure 1B:
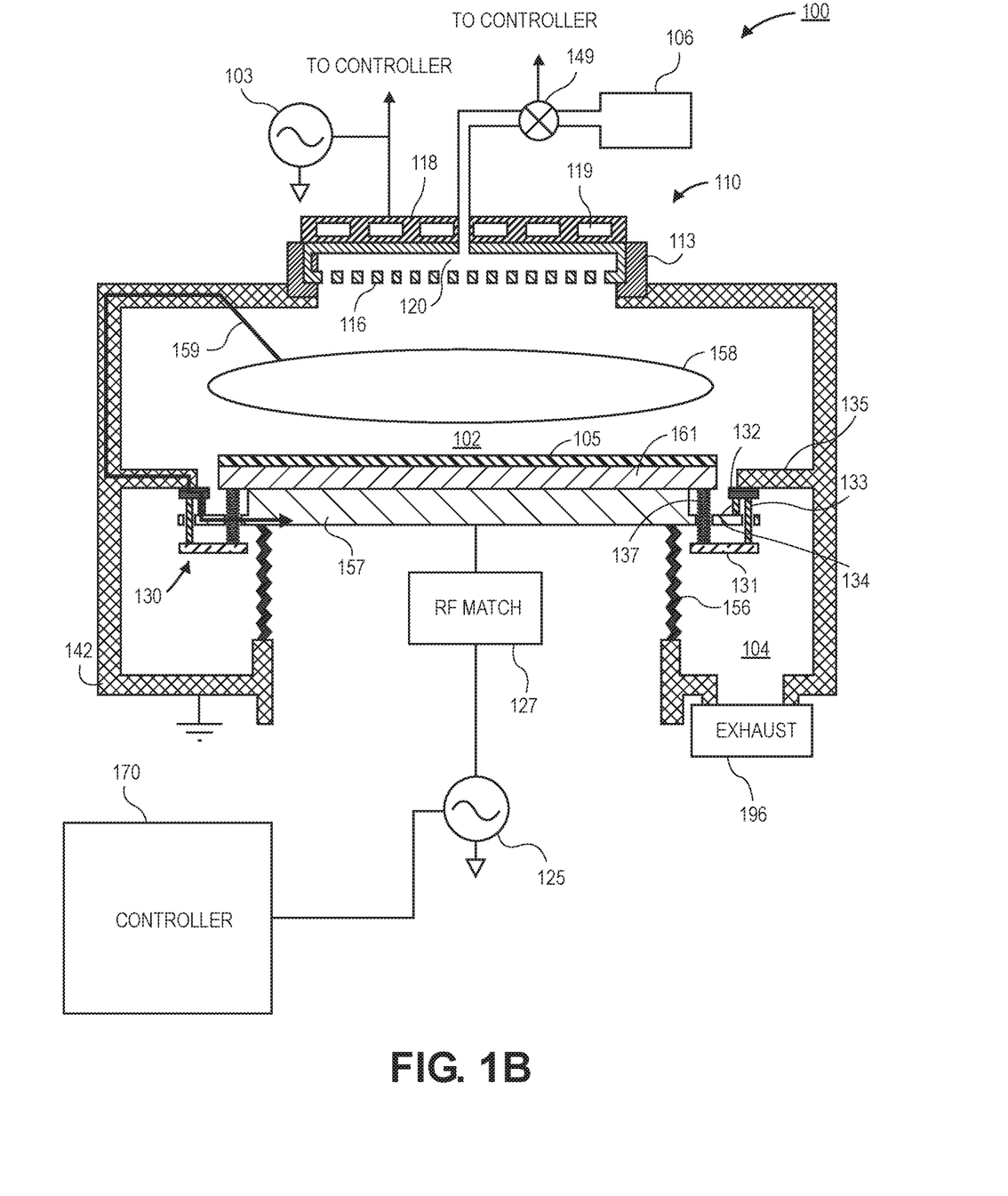
FIG. 1B is a cross-sectional illustration of a plasma chamber that includes an RF return assembly, in accordance with an embodiment.

An example of a plasma chamber 100 that utilizes such an RF return assembly 130 is shown in FIG. 1B. In an embodiment, the RF return assembly 130 comprises a first ring 132 that is affixed to a second ring 131 by a pillar 133. The first ring 132 is brought into contact with an RF return ledge 135. A flexible conductive band 134 electrically couples the first ring 132 to the support member 157. As such, the RF return path 159 may pass along the chamber body 142, into the RF return ledge 135, into the first ring 132, through the conductive band 134, and into the support member 157. This path bypasses the baffle 156. In an embodiment, the first ring 132 is held against the RF return ledge 135 by a spring 137 that is attached between the second ring 131 and the lower electrode 161. The spring 137 may be a tension spring. As such, as the support member 157 and the lower electrode 161 are displaced vertically, the spring 137 expands and supplies a force that pulls the first ring 132 and the second ring 131 up against the RF return ledge 135. This allows for the RF return path 159 to remain shorted around the baffle 156 in many different positions of the plasma chamber 100.

Figure 2A:
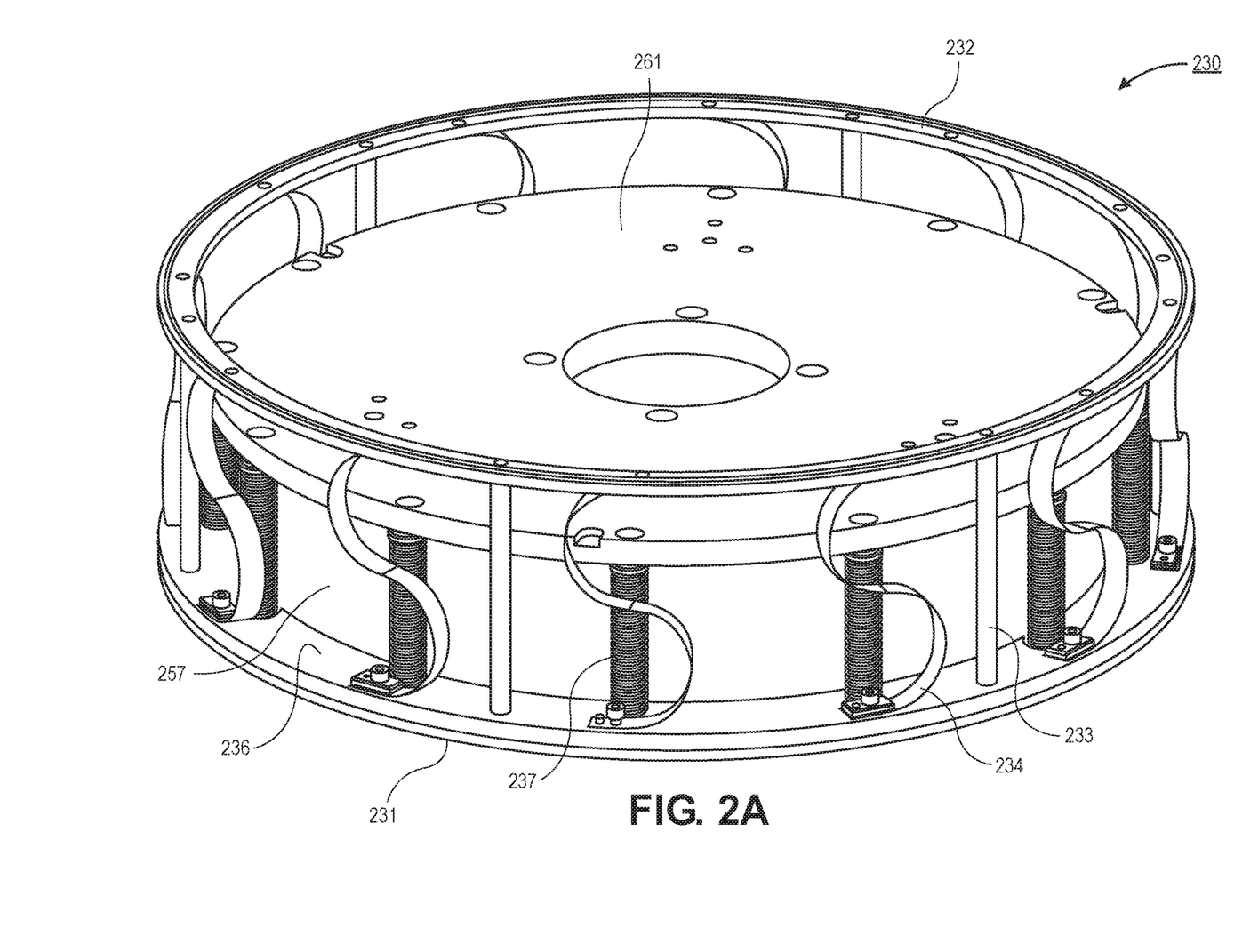
FIG. 2A is a perspective view illustration of an RF return assembly in a first position, in accordance with an embodiment.
Figure 2B:
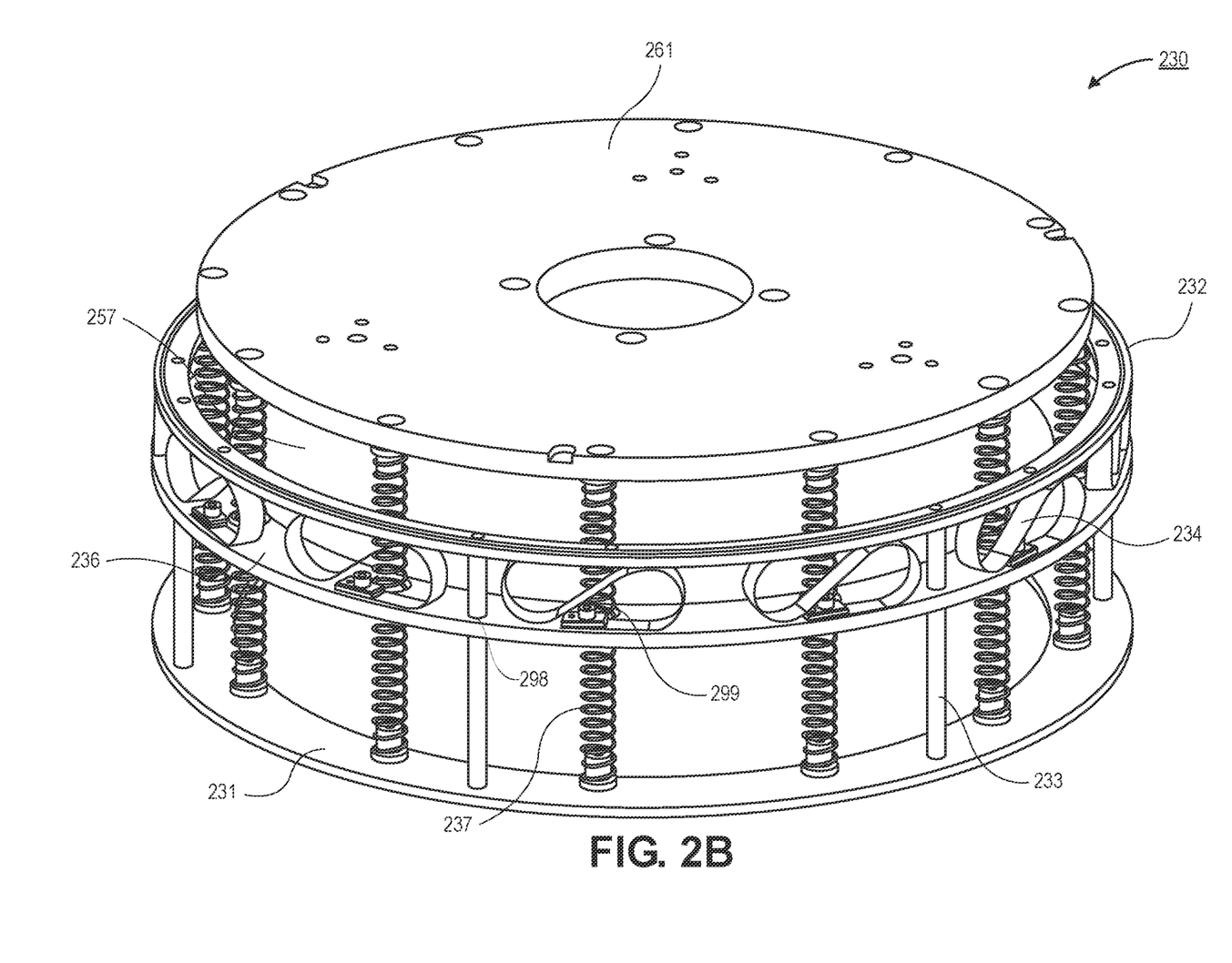
FIG. 2B is a perspective view illustration of the RF return assembly in a second position, in accordance with an embodiment.

Referring now to FIGS. 2A and 2B, perspective view illustrations of an RF return assembly 230 in different positions are shown, in accordance with an embodiment. FIG. 2A illustrates the RF return assembly 230 in a non-actuated state (i.e., when the springs 237 are not extended), and FIG. 2B illustrates the RF return assembly 230 in an actuated state (i.e., when the springs 237 are extended).

In an embodiment, the RF return assembly 230 comprises a first plate 257 and a second plate 261 over the first plate 257. In an embodiment, the first plate 257 may be a support member of a pedestal in a plasma chamber. The second plate 261 may be a component of a chuck on which a workpiece is supported in the plasma chamber. For example, the second plate 261 may be a heater plate and/or a portion of a lower electrode. In an embodiment, the first plate 257 may comprise a flange 236. The flange 236 may surround (or partially surround) a lower portion of the first plate 257.

In an embodiment, the RF return assembly 230 further comprises a first body 232 and a second body 231. As used herein, the first body 232 may be referred to as a first ring 232, and the second body 231 may be referred to as a second ring 231. However, it is to be appreciated that the first body 232 and the second body 231 may not necessarily be complete rings, as will be described in greater detail below. In an embodiment, the first ring 232 is mechanically coupled to the second ring 231 by a plurality of pillars 233. The pillars 233 have a fixed length. As such, displacement of the first ring 232 results in an equal displacement of the second ring 231. In an embodiment, the first ring 232 is above the flange 236 and the second ring 231 is below the flange 236. The pillars 233 may pass through first holes 298 through the flange 236. In an embodiment, the pillars 233 are formed with an insulating material in order to limit electrical coupling between the first ring 232 and the second ring 231. For example, the pillars 233 may be ceramic pillars.

In an embodiment, the RF return assembly 230 further comprises a plurality of springs 237. The springs 237 are connected between the second plate 261 and the second ring 231. The springs 237 may pass through second holes 299 in the flange 236. In an embodiment, the springs 237 are tension springs 237. That is, in the actuated state (e.g., FIG. 2B), the springs 237 provide a force that pulls the second ring 231 upwards. As will be described in greater detail below, this upward force is transferred to the first ring 232 through the pillars 233 to secure the first ring 232 against an RF return ledge (not shown in FIGS. 2A and 2B) of the plasma chamber.

In an embodiment, the RF return assembly further comprises one or more conductive bands 234. The conductive bands 234 are attached between the first ring 232 and the first plate 257. In some embodiments, the conductive bands 234 are attached to the flange 236 of the first plate 257. The conductive bands 234 have a shape that allows for flexing and contracting. For example, in the non-actuated state (e.g., FIG. 2A) the conductive bands 234 have a first stand-off height, and in the actuated state (e.g., FIG. 2B) the conductive bands 234 are contracted and have a second stand-off height that is smaller than the first stand-off height. In some embodiments, the first stand-off height may be approximately 85 mm or greater, approximately 95 mm or greater, or approximately 100 mm or greater. In another embodiment, the second stand-off height may be approximately 50 mm or greater, approximately 75 mm or greater, or approximately 90 mm or greater. The ability to flex and contract the conductive bands 234 allows for an RF return path from the first ring 232 to the first plate 257 to be provided regardless of the position of the first ring 232 with respect to the first plate 257. In an embodiment, the conductive bands 234 may be steel (e.g., stainless steel), aluminum, titanium, or any other suitable conductive material.

In the illustrated embodiments depicted in FIGS. 2A and 2B, twelve conductive bands 234 and twelve springs 237 are shown in each RF return assembly 230. However, it is to be appreciated that any number of conductive bands 234 and springs 237 may be used. For example, a number of conductive bands 234 may be different than a number of springs 237. Additionally, each of the conductive bands 234 are shown as being adjacent to one of the springs 237. However, it is to be appreciated that embodiments are not limited to such configurations. For example, one or more conductive bands 234 may be located between a pair of springs 237.

Figure 3:
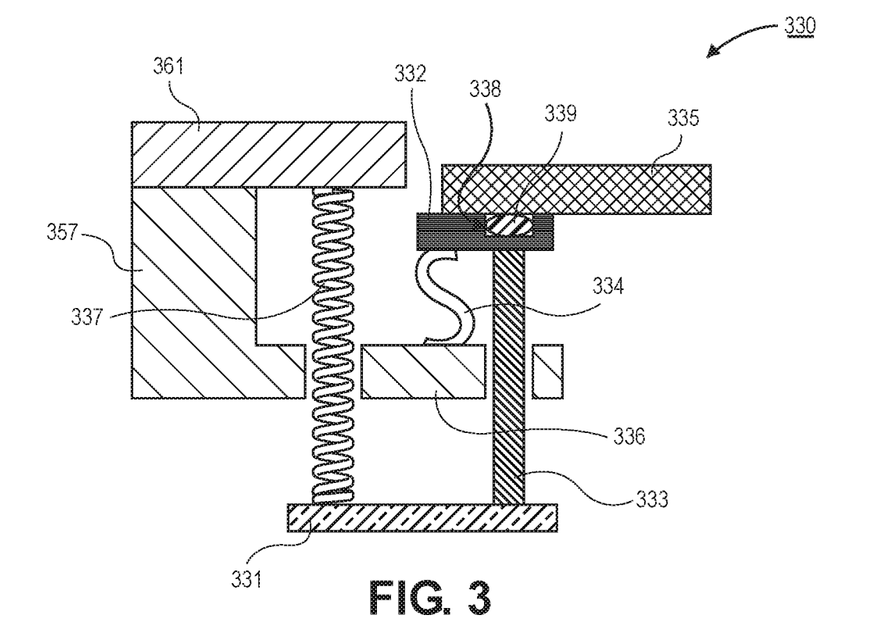
FIG. 3 is a cross-sectional illustration of a portion of the RF return assembly, in accordance with an embodiment.

Referring now to FIG. 3, a cross-sectional illustration of a portion of an RF return assembly 330 is shown, in accordance with an embodiment. FIG. 3 provides an illustration of how the various components interface with each other. In FIG. 3, a spring 337, a conductive band 334, and a pillar 333 are all shown in a single cross-section for simplicity in order to illustrate how the various components work together. However, it is to be appreciated that the spring 337, the conductive band 334, and/or the pillar 333 may not be visible in a single cross-section and/or may have other orientations with respect to each other.

In an embodiment, the first ring 332 is pressed against the RF return ledge 335. In some embodiments, a groove 338 in the first ring 332 may be filled by an RF gasket 339. The RF gasket 339 is compressed against the RF return ledge 335 to provide improved electrical coupling between the first ring 332 and the RF return ledge 335.

The first ring 332 is secured to a second ring 331 by the pillar 333. The second ring 331 is also attached to a second plate 361 (which is over a first plate 357) by the spring 337. The pillar 333 and the spring 337 may pass through holes in a flange 336 of the first plate 357. The pillar 333 and the spring 337 mechanically couple the second plate 361, the first ring 332, and the second ring 331 together, so that displacement of the second plate 361 may result in displacement of the first ring 332 and the second ring 331. However, the RF return ledge 335 limits the vertical displacement of the first ring 332 and the second ring 331. After the maximum vertical displacement of the first ring 332 is reached (as shown in FIG. 3), the spring 337 is extended as the first plate 357 and the second plate 361 continue to be raised. As such, the spring 337 provides a force that secures the first ring 332 against the RF return ledge 335.

Additionally, the first ring 332 is electrically coupled to the first plate 357 by a conductive band 334. The conductive band 334 has a shape that allows for expansion or contraction as the first plate 357 is displaced relative to the first ring 332. In this way, the conductive band 334 maintains an electrical path from the first ring 332 to the first plate 357 in various positions. For example, the conductive band 334 may provide an electrical path between the first ring 332 and the first plate 357 when the processing chamber is in a cleaning position or in a processing position. An S-shaped conductive band 334 is shown in FIG. 3. However, it is to be appreciated that any suitable conductive band that is flexible (i.e., able to extend or contract) may be used.

Examples of suitable structures for the conductive band 334 are provided in FIGS. 4A-5B.

Figure 4A:
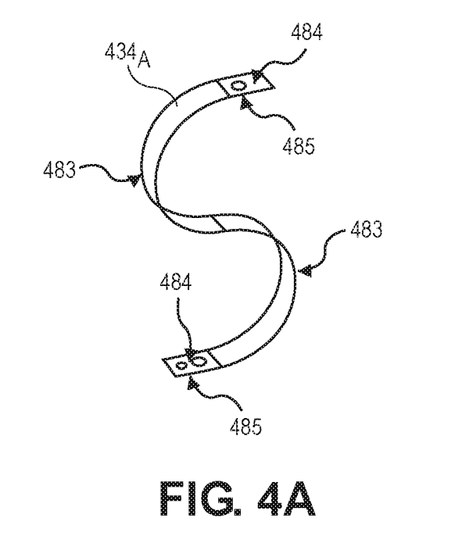
FIG. 4A is a perspective view illustration of a conductive band with an S-shaped profile, in accordance with an embodiment.
Figure 4B:
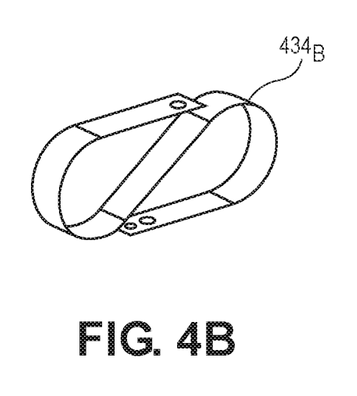
FIG. 4B is a perspective view illustration of the conductive band in FIG. 4A after it has been compressed, in accordance with an embodiment.

Referring now to FIGS. 4A and 4B, perspective view illustrations of an S-shaped conductive band 434 in an expanded position (FIG. 4A) and a contracted position (FIG.

4B) is shown, in accordance with an embodiment. As shown, the conductive band 434A has a substantially S-shaped profile. In some embodiments, an S-shaped profile may refer to a conductive band 434 that has at least a pair of turns 483. For example, each turn 483 in FIG. 4A provides an approximately 180° direction turn. While an S-shape with a pair of turns 483 is shown in FIG. 4A, it is to be appreciated that conductive bands 434 may have any number of turns 483.

As the distance between the first ring 332 and the first plate 357 decreases, the S-shaped profile is contracted, as shown in the conductive band 434B in FIG. 4B. The conductive band 434 may have dimensions of a ribbon. That is, a total length of the conductive band 434 may be greater than a width of the conductive band 434. A thickness of the conductive band 434 may be smaller than the width of the conductive band 434. In other embodiments, the conductive band 434 may also be a wire. That is, a width and a thickness of the conductive band 434 may be substantially uniform.

In an embodiment, the conductive band 434 has a first surface 484 and a second surface 485. Due to the presence of two turns 483, the first surface 484 may contact the first ring 332, and the second surface 485 may contact the first plate 357. That is, each surface of the conductive band 434 may contact a single one of the first ring 332 and the first plate 357. However, in other embodiments, a single surface of the conductive band 434 may contact both the first ring 332 and the first plate 357 when an odd number of turns 483 are present.

Figure 5A:
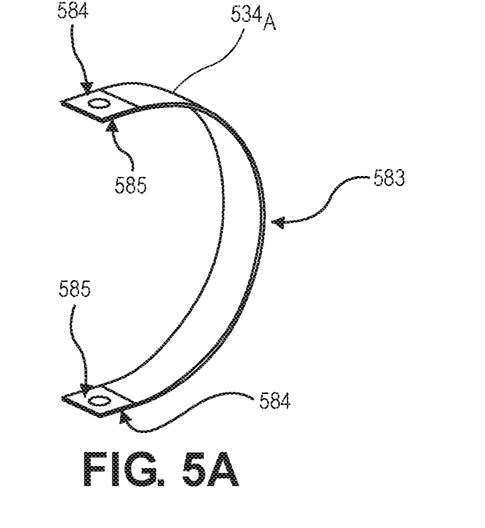
FIG. 5A is a perspective view illustration of a conductive band with a C-shaped profile, in accordance with an embodiment.
Figure 5B:
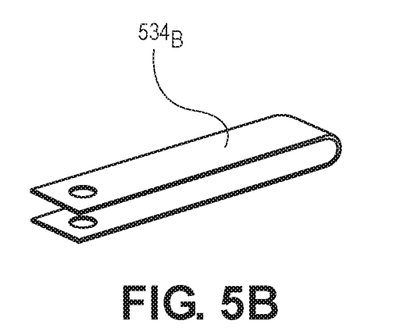
FIG. 5B is a perspective view illustration of the conductive band in FIG. 5A after it has been compressed, in accordance with an embodiment.

FIGS. 5A and 5B provide an example of such an embodiment. FIG. 5A illustrates the conductive band $534_A$ in an uncompressed state, and FIG. 5B illustrates the conductive band $534_B$ in a compressed state. As shown, the conductive band $534_A$ has a substantially C-shaped profile. That is, the conductive band 534 has a single 180° turn 583. Therefore, only the first surface 584 is in contact with a first plate 357 and the first ring 332. The second surface 585 does not contact either the first plate 357 or the first ring 332.

Figure 6:
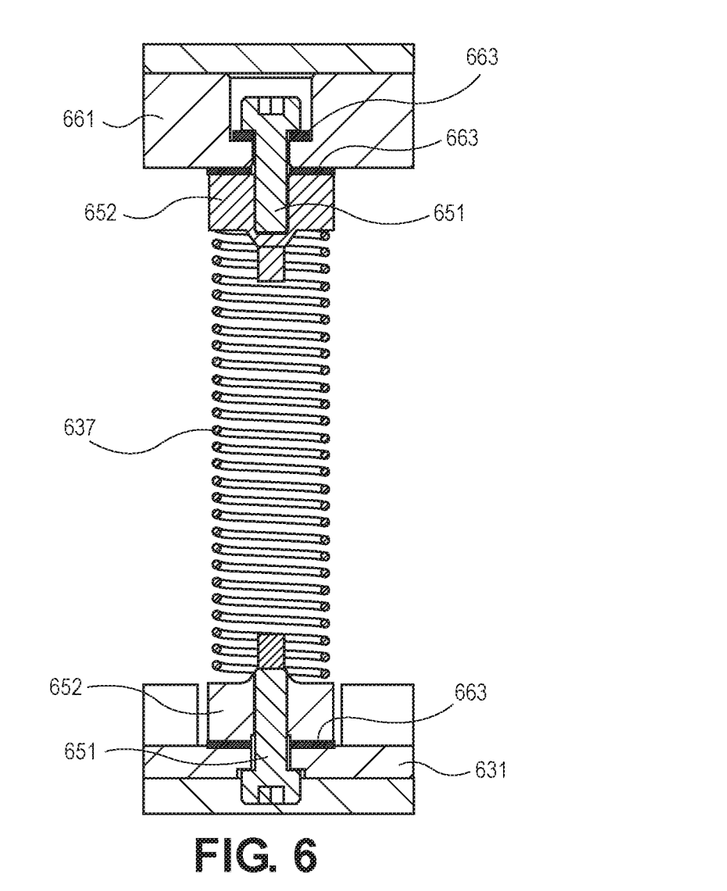
FIG. 6 is a cross-sectional illustration of a spring in the RF return assembly, in accordance with an embodiment.

Referring now to FIG. 6, a cross-sectional illustration of a spring 637 that may be used in an RF return assembly is shown, in accordance with an embodiment. In an embodiment, the spring 637 is a tension spring. The spring 637 may be formed with any suitable materials. For example, the spring 637 may be steel, a nickel alloy, or the like. As shown, the spring 637 is attached between a second plate 661 and a second ring 631. In order to provide improved reliability, the spring 637 is attached by screws 651 or bolts instead of hooks. For example, the spring 637 may include end portions 652 that are threaded. Screws 651 may pass through portions of the second plate 661 and the second ring 631 and be threaded into the end portions 652. In order to limit electrical conduction between the second plate 661 and the second ring 631, insulating washers 663 may be included between the end portions 652 and the second plate 661 and the second ring 631. In an embodiment, the screws 651 may also be formed with an insulating material.

Figure 7:
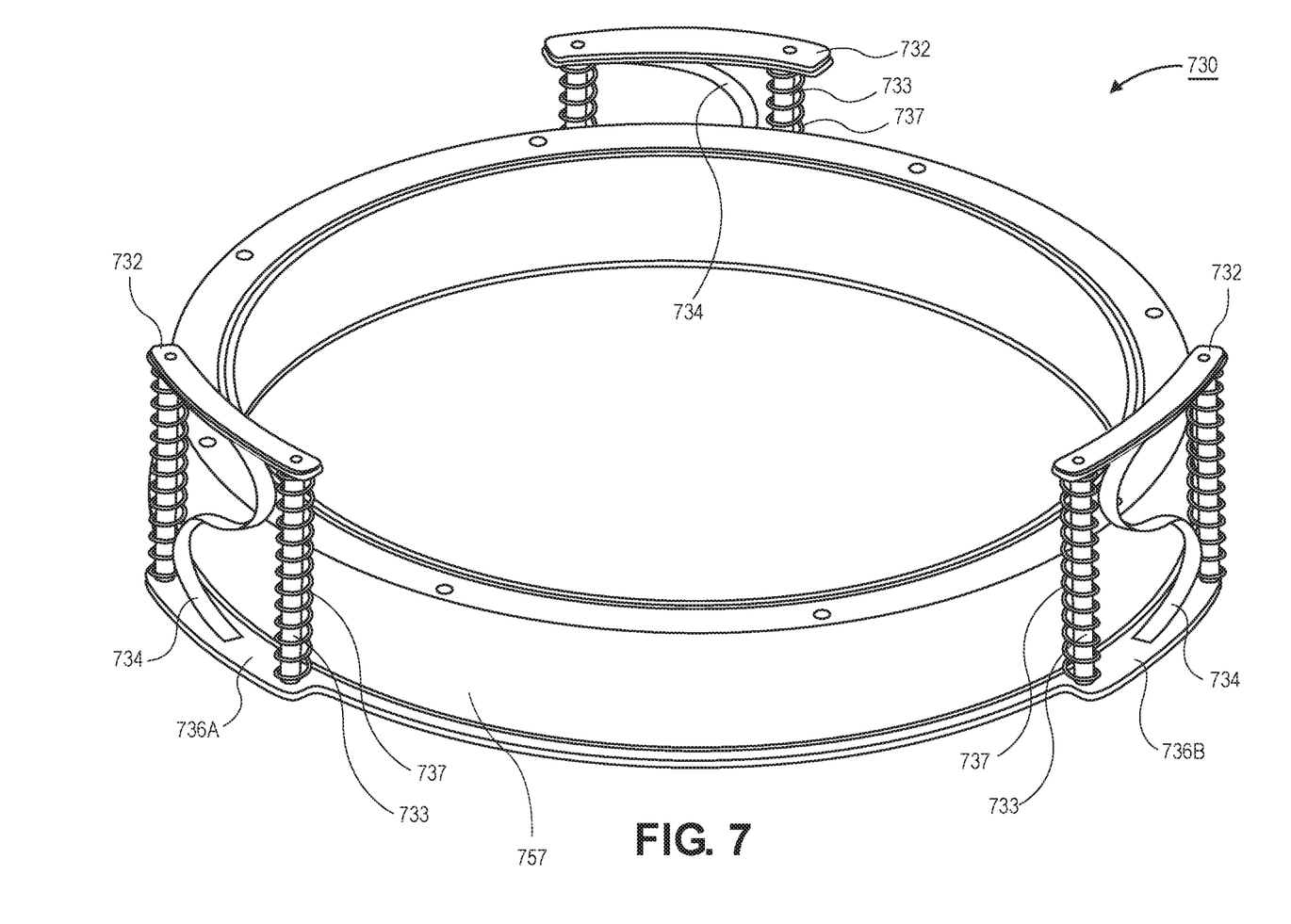
FIG. 7 is a perspective view illustration of a portion of an RF return assembly, in accordance with an additional embodiment.

Referring now to FIG. 7, a schematic illustration of an RF return assembly 730 is shown, in accordance with an additional embodiment. As shown, the first plate 757 may have a plurality of flanges 736. For example, flange $736_A$ and flange $736_B$ are visible in FIG. 7. A compression assembly is provided on each flange 736. The compression assembly comprises a first body 732. The first body 732 is attached to the flange 736 by a pair of springs 737. Guide pillars 733 pass through a center of the springs 737 and are also attached to the first body 732. As the first plate 757 is displaced vertically, the first body 732 contacts an RF return ledge (not shown), and the springs 737 begin to compress with the guide pillar 733 passing through a hole in the flange 736.

In an embodiment, the compression assembly may also comprise a conductive band 734 between the first body 732 and the first plate 757. Particularly, the conductive band 734 may land on the flange 736 in some embodiments. The conductive band 734 may be substantially similar to those described above. For example, the conductive band 734 may have an S-shaped profile, a C-shaped profile, or any other suitable profile that allows for expansion and contraction. As such, an electrical path from the first body 732 to the first plate 757 is maintained at various positions of the first plate 757 relative to the first body 732.

In FIG. 7, three compression assemblies are shown. However, it is to be appreciated that any number of compression assemblies may be used in the RF return assembly, and that the illustration in FIG. 7 is exemplary in nature.

Figure 8A:
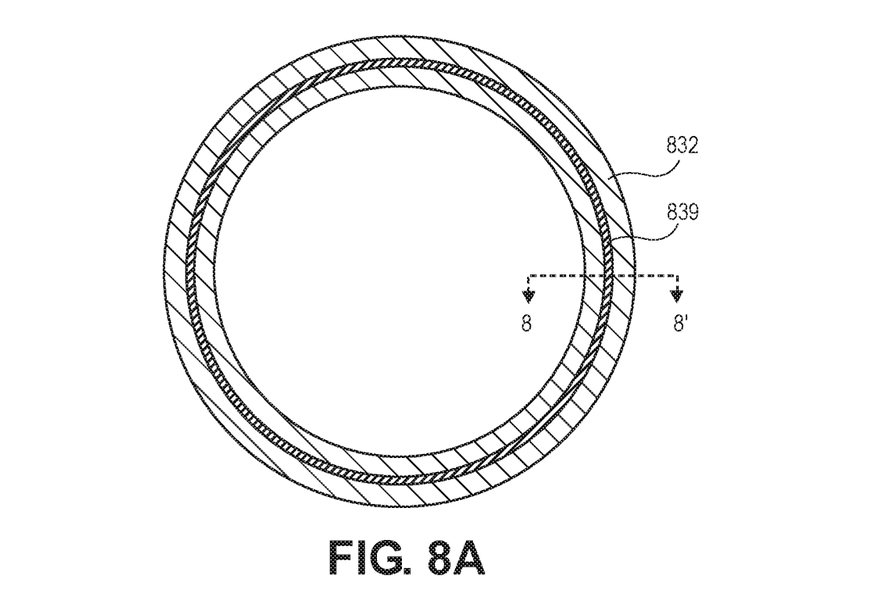
FIG. 8A is a plan view illustration of a top ring with an RF gasket, in accordance with an embodiment.

Referring now to FIG. 8A, a plan view illustration of a first ring 832 is shown, in accordance with an embodiment. In an embodiment, the first ring 832 is the component of an RF return assembly that contacts the RF return ledge. As such, a high quality electrical interface needs to be made between the components. In order to provide such an improved electrical interface, the first ring 832 may comprise an RF gasket 839. In an embodiment, a single RF gasket 839 that forms a ring is provided. In other embodiments, a plurality of discrete RF gaskets 839 are arranged around a perimeter of the first ring 832.

Figure 8B:
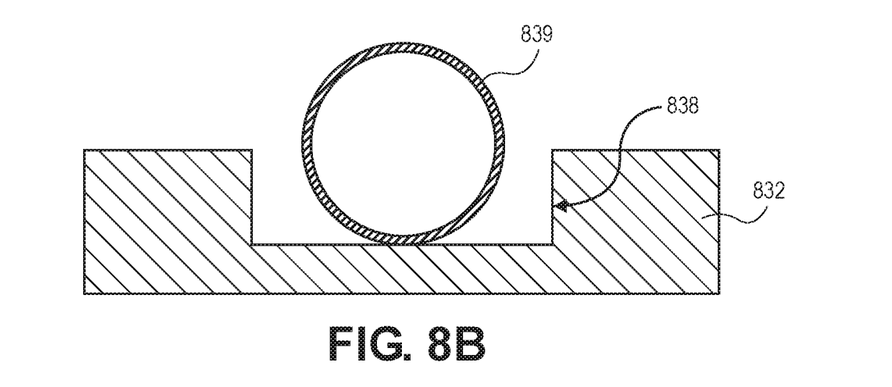
FIG. 8B is a cross-sectional illustration of the top ring in FIG. 8A along line 8-8', in accordance with an embodiment.

Referring now to FIG. 8B, a cross-sectional illustration of the first ring 832 in FIG. 8A along line 8-8' is shown, in accordance with an embodiment. In an embodiment, the RF gasket 839 may be disposed in a channel 838 into the first ring 832. The RF gasket 839 may be a conductive loop. That is, the RF gasket 839 may be have a tubular cross-section, as shown in FIG. 8B. In an embodiment, the thickness of the RF gasket 839 may be chosen so that the RF gasket 839 is easily deformable to conform to the channel 838 and the RF return ledge. In an embodiment, the RF gasket 839 may comprise a spring steel.

Figure 8C:
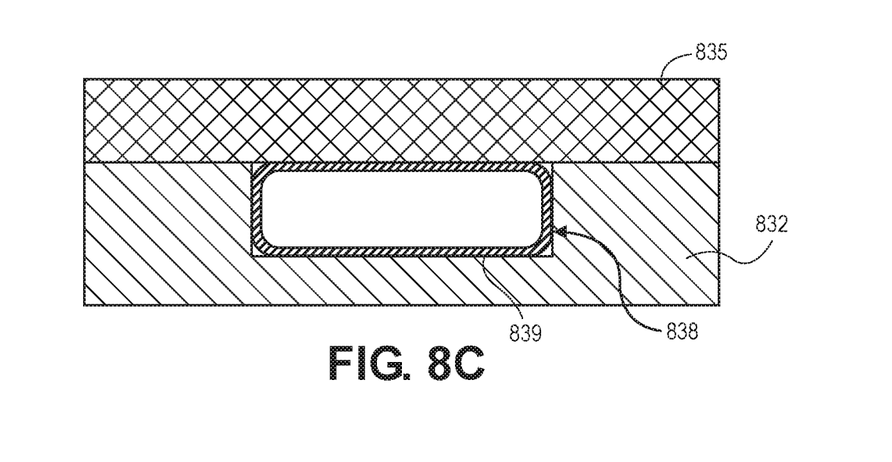
FIG. 8C is a cross-sectional illustration of the RF gasket being compressed against an RF return ledge, in accordance with an embodiment.

Referring now to FIG. 8C, a cross-sectional illustration after the first ring 832 is pressed against an RF return ledge 835 is shown, in accordance with an embodiment. In an embodiment, pressing the first ring 832 against the RF return ledge 835 results in the compression of the RF gasket 839. As shown, the compressed RF gasket 839 more closely conforms to the shape of the channel 838 to provide a better electrical connection between the first ring 832 and the RF return ledge 835.

Figure 9A:
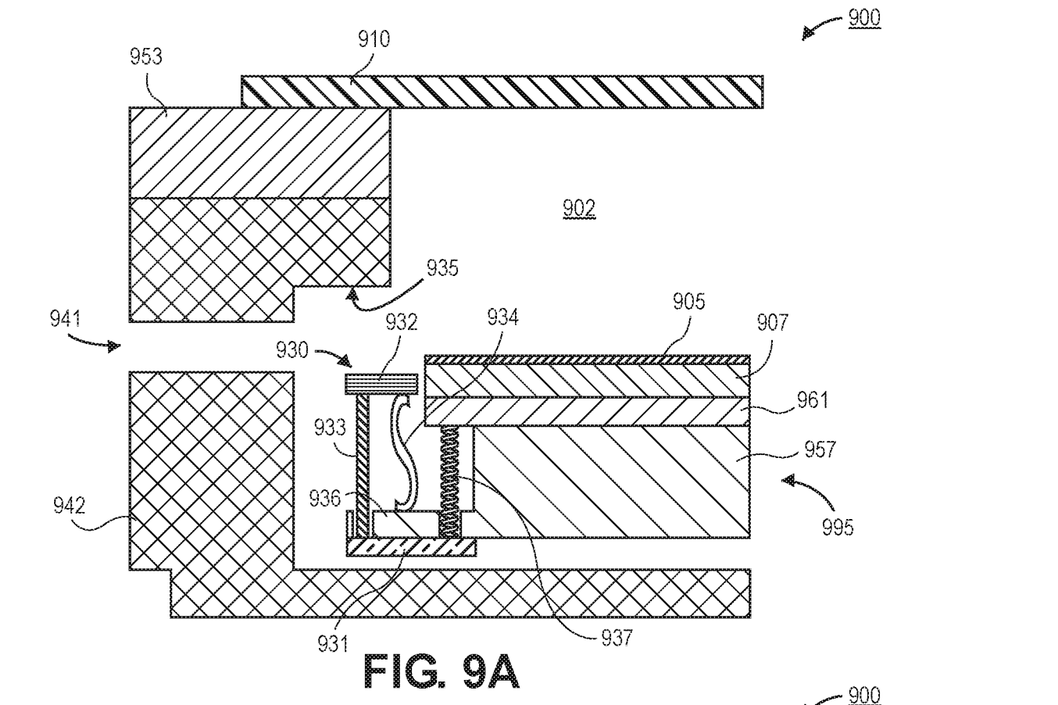
FIG. 9A is a cross-sectional illustration of a portion of a plasma chamber that illustrates the RF return assembly in a first workpiece loading position, in accordance with an embodiment.
Figure 9B:
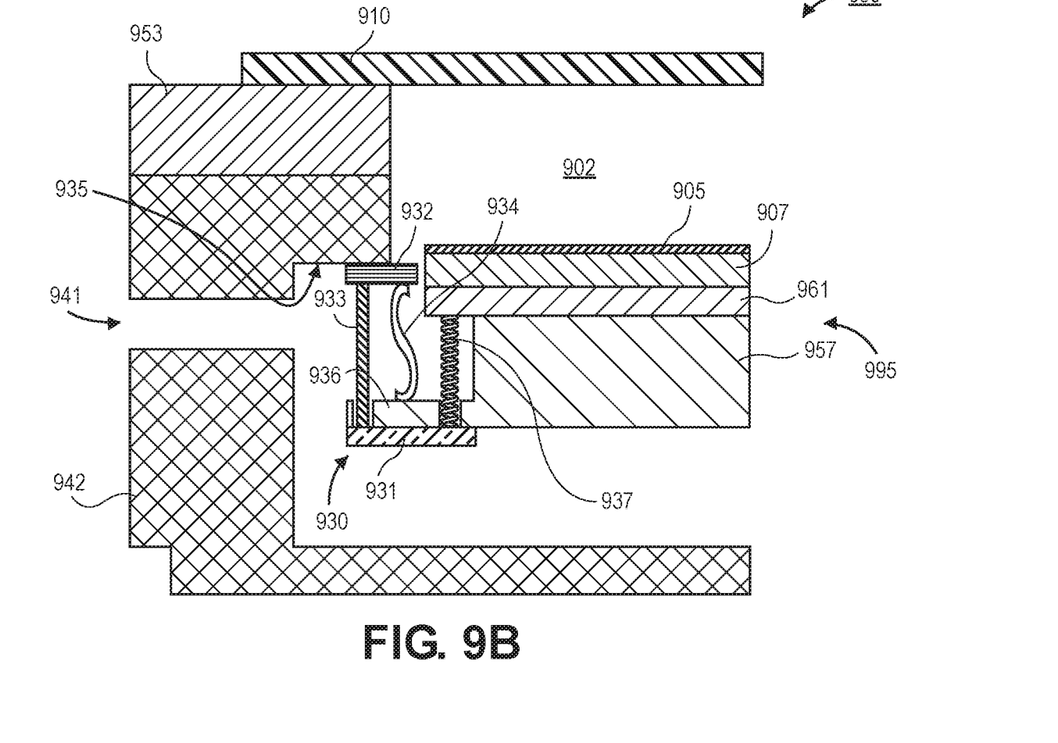
FIG. 9B is a cross-sectional illustration of the portion of the plasma chamber where the RF return assembly is in a second chamber cleaning position, in accordance with an embodiment.
Figure 9C:
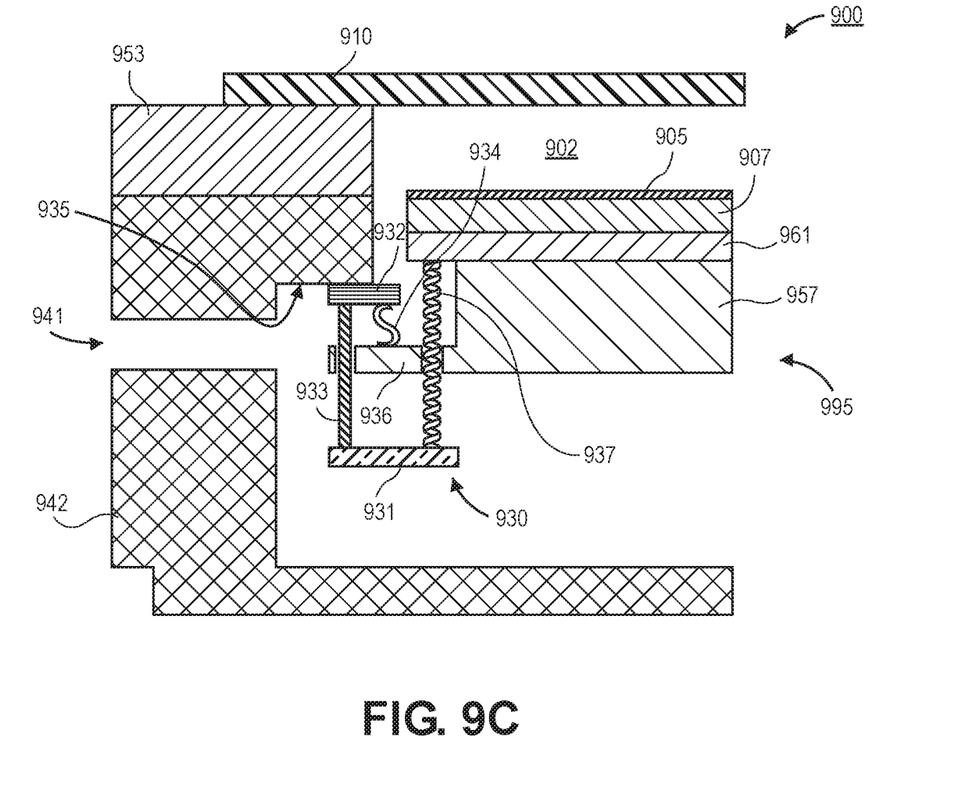
FIG. 9C is a cross-sectional illustration of the portion of the plasma chamber where the RF return assembly is in a third workpiece processing position, in accordance with an embodiment.

Referring now to FIGS. 9A-9C, a series of cross-sectional illustrations depicting an RF return assembly 930 in various positions within a plasma chamber 900 is shown, in accordance with an embodiment.

Referring now to FIG. 9A, a cross-sectional illustration of a plasma chamber 900 is shown, in accordance with an embodiment. In an embodiment, the plasma chamber 900 comprises a chamber body 942, a pumping ring 953 over the chamber body 942, and a face plate 910 (or lid assembly) over the pumping ring 953. In an embodiment, a slot 941 is disposed through the chamber body 942. The slot is sized to accommodate substrates 905 inserted into (or removed from) the chamber body 942. A door or other seal for the slot 941 is omitted for clarity.

In an embodiment, the plasma chamber 900 may comprise a vertically displaceable pedestal 995. The pedestal 995 may comprise a first plate 957, a second plate 961, and a third plate 907. For example, the first plate 957 may comprise a support member, the second plate 961 may comprise a heater, and the third plate 907 may comprise a lower electrode. The components of the pedestal 995 illustrated in FIG. 9A are exemplary in nature. It is to be appreciated that additional components (or fewer components) may also be included in the pedestal 995, as is common in plasma chambers.

In an embodiment, the plasma chamber 900 may further comprise an RF return assembly 930. The RF return assembly 930 may comprise a first ring 932 and a second ring 931. The first ring 932 may be mechanically coupled to the second ring 931 by a pillar 933. The pillar passes through a hole through a flange 936 of the first plate 957. In an embodiment, the second ring 931 is joined to the second plate 961 by a spring 937. The spring 937 may also pass through a hole in the flange 936. In an embodiment, a conductive band 934 electrically couples the first ring 932 to the first plate 957. The conductive band 934 may be flexible so that it can contract and expand to different stand-off heights. For example, the conductive band 934 may have an S-shaped profile or a C-shaped profile.

In the embodiment illustrated in FIG. 9A, the pedestal 995 is in a substrate loading and unloading position. That is, the pedestal 995 is positioned so that a substrate 905 may be inserted through the slot 941 and placed over the third plate 907. In the substrate loading and unloading position, the second ring 931 may be pulled up to a bottom surface of the first plate 957 by the spring 937. Additionally, the first ring 932 may not be in contact with the RF return ledge 935. This is suitable since there is typically no plasma present during loading and unloading of the plasma chamber 900.

Referring now to FIG. 9B, a cross-sectional illustration of the plasma chamber 900 in a cleaning position is shown, in accordance with an embodiment. As shown, the pedestal 995 has been vertically displaced into the processing region 902 so that the top surface of the pedestal 995 is above the slot 941. In this position, the first ring 932 is now in contact with the RF return ledge 935. In an embodiment, the first and second rings 932/931 and the pedestal 995 move substantially in uniform between the first position of FIG. 9A and the second position of FIG. 9B. While in the second position of FIG. 9B, an RF return path is provided from the RF return ledge 935, into the first ring 932, into the conductive band 934, and into the first plate 957. As such, the RF return path is shortened, and parasitic plasmas to the side and below the pedestal are eliminated.

Referring now to FIG. 9C, a cross-sectional illustration of the plasma chamber 900 in a plasma processing position is shown, in accordance with an embodiment. As shown, the pedestal 995 is displaced in the vertical direction again so that the substrate 905 is within the pumping ring 953. Due to the RF return ledge 935 blocking further vertical displacement of the first ring 932, the spring 937 is extended. That is, between the second position of FIG. 9B and the third position of FIG. 9C, the pedestal 995 and the first and second rings 932/931 may not move in unison. In an embodiment, the displacement of the pedestal 995 between the second position and the third position may be several inches or more. For example, the displacement may be approximately two inches or more. Particularly, the pedestal 995 displaces while the first and second rings 932/931 remain stationary. Additionally, the conductive band 934 contracts to accommodate for the change in the separation between the flange 936 and the first ring 932.

Figure 10:
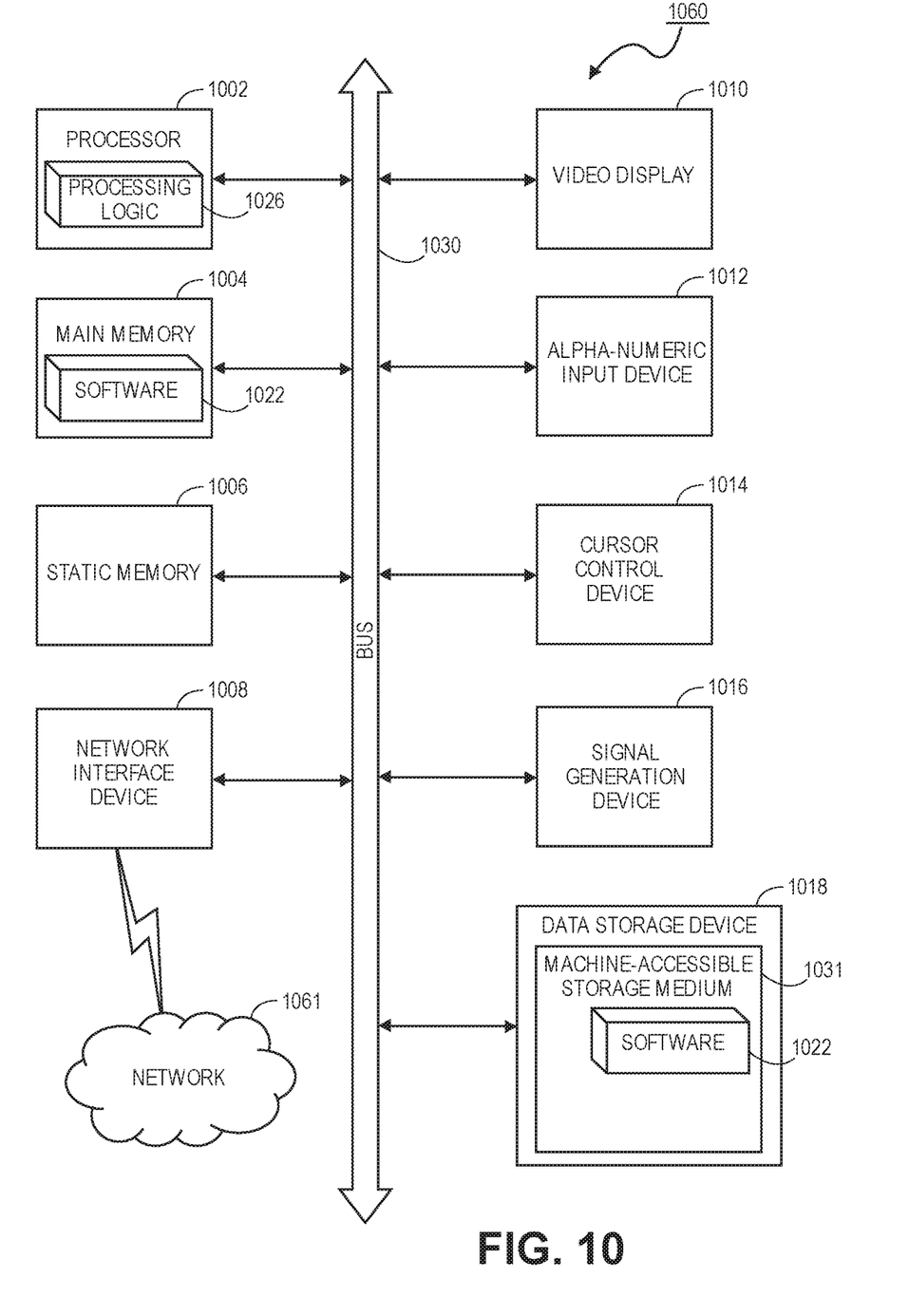
FIG. 10 illustrates a block diagram of an exemplary computer system that may be used in conjunction with plasma chamber, in accordance with an embodiment.

Referring now to FIG. 10, a block diagram of an exemplary computer system 1060 of a processing tool that may be used in accordance with an embodiment is shown. In an embodiment, computer system 1060 is coupled to and controls processing in the plasma chamber. Computer system 1060 may be connected (e.g., networked) to other machines in a Local Area Network (LAN), an intranet, an extranet, or the Internet. Computer system 1060 may operate in the capacity of a server or a client machine in a client-server network environment, or as a peer machine in a peer-to-peer (or distributed) network environment. Computer system 1060 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 1060, the term "machine" shall also be taken to include any collection of machines (e.g., computers) that individually or jointly execute a set (or multiple sets) of instructions to perform any one or more of the methodologies described herein.

Computer system 1060 may include a computer program product, or software 1022, having a non-transitory machine-readable medium having stored thereon instructions, which may be used to program computer system 1060 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 1060 includes a system processor 1002, a main memory 1004 (e.g., read-only memory (ROM), flash memory, dynamic random access memory (DRAM) such as synchronous DRAM (SDRAM) or Rambus DRAM (RDRAM), etc.), a static memory 1006 (e.g., flash memory, static random access memory (SRAM), etc.), and a secondary memory 1018 (e.g., a data storage device), which communicate with each other via a bus 1030.

System processor 1002 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 1002 may also be one or more special-purpose processing devices such as an application specific integrated circuit (ASIC), a field programmable gate array (FPGA), a digital signal system processor (DSP), network system processor, or the like. System processor 1002 is configured to execute the processing logic 1026 for performing the operations described herein.

The computer system 1060 may further include a system network interface device 1008 for communicating with other devices or machines. The computer system 1060 may also include a video display unit 1010 (e.g., a liquid crystal display (LCD), a light emitting diode display (LED), or a cathode ray tube (CRT)), an alphanumeric input device 1012

(e.g., a keyboard), a cursor control device 1014 (e.g., a mouse), and a signal generation device 1016 (e.g., a speaker).

The secondary memory 1018 may include a machine-accessible storage medium 1031 (or more specifically a computer-readable storage medium) on which is stored one or more sets of instructions (e.g., software 1022) embodying any one or more of the methodologies or functions described herein. The software 1022 may also reside, completely or at least partially, within the main memory 1004 and/or within the system processor 1002 during execution thereof by the computer system 1060, the main memory 1004 and the system processor 1002 also constituting machine-readable storage media. The software 1022 may further be transmitted or received over a network 1020 via the system network interface device 1008.

While the machine-accessible storage medium 1031 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. An RF return assembly, comprising:
   a first plate with a flange, wherein a first hole passes through the flange, and a second hole passes through the flange;
   a second plate over the first plate;
   a first body positioned above the flange;
   a second body positioned below the flange, wherein the first body is affixed to the second body by a pillar that passes through the first hole;
   a spring attached between the second plate and the second body, wherein the spring passes through the second hole; and
   a conductive band to electrically couple the first body to the flange.

2. The RF return assembly of claim 1, wherein the first plate and the second plate are displaceable relative to the first body and the second body.

3. The RF return assembly of claim 2, wherein the conductive band is flexible to maintain electrical contact between the first body and the flange as the first plate displaces relative to the first body.

4. The RF return assembly of claim 3, wherein the conductive band has an S-shaped profile.

5. The RE return assembly of claim 3, wherein the conductive band has a C-shaped profile.

6. The RF return assembly of claim 1, wherein the first body and the second body are rings.

7. The RF return assembly of claim 1, wherein the first body comprises a channel, and wherein an RF gasket is disposed in the channel.

8. The RF return assembly of claim 7, wherein the RF gasket is a spring loop.

9. The RF return assembly of claim 1, wherein the spring is a tension spring.

10. The RF return assembly of claim 9, wherein ds of the spring are threaded, and wherein the spring is attached to the second plate and the second body by a screw.

11. A plasma chamber, comprising:
    a chamber body, wherein the chamber body comprises:
      an opening sized to receive a workpiece; and
      an RF return ledge above the opening;
    a lid to seal the chamber body;
    a pedestal for supporting the workpiece, wherein the pedestal comprises:
      a first plate with a flange; and
      a second plate attached to the first plate; and
    an RF return assembly, wherein the RF return assembly electrically couples the RF return ledge to the pedestal, and wherein the RF return assembly comprises:
      a first ring, wherein the first ring is above the flange;
      a second ring, wherein the second ring is below the flange;
      a pillar to affix the first ring to the second ring, wherein the pillar passes through the flange;
      a tension spring, wherein the tension spring is attached between the second plate and the second ring, and wherein the tension spring passes through the flange; and
      a conductive band, wherein the conductive band electrically couples the first ring to the flange.

12. The plasma chamber of claim 11, wherein the pedestal is displaceable in a vertical direction, and wherein the plasma chamber comprises a first position where a top surface of the pedestal is below the opening, a second position where the top surface of the pedestal is above the opening, and a third position where the top surface of the pedestal is above the location of the top surface of the pedestal in the second position.

13. The plasma chamber of claim 12, wherein the second position is a cleaning position, and wherein the third position is for implementing a plasma process on the workpiece.

14. The plasma chamber of claim 12, wherein the first ring contacts the RF return ledge when the pedestal is in the second position and the third position.

15. The plasma chamber of claim 14, wherein the pedestal displaces approximately two or more inches between the second position and the third position.

16. The plasma chamber of claim 11, wherein the conductive band is flexible to maintain electrical contact between the first ring and the flange as the first plate displaces relative to the first ring.

17. A plasma chamber, comprising:
    a chamber body, wherein the chamber body comprises:
      an opening sized to receive a workpiece; and
      an RF return ledge above the opening;
    a lid to seal the chamber body;
    a pedestal for supporting the workpiece, wherein the pedestal comprises:
      a first plate with a flange; and
      a second plate attached to the first plate; and
    an RF return assembly, wherein the RF return assembly electrically couples the RF return ledge to the pedestal, wherein the RF return assembly comprises:
      a first ring, wherein the first ring is above the flange;
      a second ring, wherein the second ring is below the flange;
      a pillar to affix the first ring to the second ring, wherein the pillar passes through the flange;

a tension spring, wherein the tension spring is attached between the second plate and the second ring, and wherein the tension spring passes through the flange; and a conductive band, wherein the conductive band electrically couples the first ring to the flange, and wherein the conductive band is flexible to maintain electrical contact between the first ring and the flange as the first plate displaces relative to the first ring.

18. The plasma chamber of claim 17, wherein the first ring comprises:

a channel, and wherein a RF gasket is in the channel.

19. The plasma chamber of claim 17, wherein the pedestal is displaceable in a vertical direction, and wherein the plasma chamber comprises a first position where a top surface of the pedestal is below the opening, a second position where the top surface of the pedestal is above the opening, and a third position where the top surface of the pedestal is above the location of the top surface of the pedestal in the second position, and wherein the first ring contacts the RF return ledge when the pedestal is in the second position and the third position.

* * * * *